(12) United States Patent
Chiyajo et al.

(10) Patent No.: US 10,424,947 B2
(45) Date of Patent: Sep. 24, 2019

(54) BATTERY MONITORING DEVICE

(71) Applicant: Yazaki Corporation, Tokyo (JP)

(72) Inventors: Yuki Chiyajo, Shizuoka (JP); Yoshiaki Nakayama, Shizuoka (JP); Kimihiro Matsuura, Shizuoka (JP); Haruhiko Yoshida, Shizuoka (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 113 days.

(21) Appl. No.: 15/869,292

(22) Filed: Jan. 12, 2018

(65) Prior Publication Data

US 2018/0233930 A1    Aug. 16, 2018

(30) Foreign Application Priority Data

Feb. 13, 2017    (JP) .................. 2017-024368

(51) Int. Cl.
*H02J 7/00* (2006.01)
*H05K 1/14* (2006.01)
(Continued)

(52) U.S. Cl.
CPC .......... *H02J 7/0021* (2013.01); *G01R 1/0416* (2013.01); *H01M 10/48* (2013.01);
(Continued)

(58) Field of Classification Search
CPC ...... H02J 7/0021; H02J 7/0014; H02J 7/0042; H01M 10/482; H01M 10/48; G01R 1/0416; G01R 1/04; G01R 31/396; H05K 1/148; H05K 1/144; H05K 1/0262; H05K 2201/042

See application file for complete search history.

(56) References Cited

U.S. PATENT DOCUMENTS 6,442,027 B2    8/2002    Sanada et al.
8,513,950 B2    8/2013    Tanabe
(Continued)

FOREIGN PATENT DOCUMENTS

JP    3-61387 U      6/1991
JP    11-164485 A    6/1999
(Continued)

OTHER PUBLICATIONS

Notification of Reasons for Refusal dated Mar. 5, 2019 from the Japanese Patent Office in application No. 2017-024368.

*Primary Examiner* — Drew A Dunn
*Assistant Examiner* — Sailesh Thapa
(74) *Attorney, Agent, or Firm* — Sughrue Mion, PLLC (57) ABSTRACT

A battery monitoring device includes a battery information input terminal, a battery state monitoring unit, an output terminal, a circuit board, and a housing member. The battery information input terminal is electrically connected to a battery state detecting member. The battery state monitoring unit receives a battery state detection signal via the battery information input terminal. The output terminal outputs monitoring information on the battery state corresponding to the battery state detection signal to an external arithmetic processor. The circuit board is provided with the battery information input terminal, the battery state monitoring unit, and the output terminal. The housing member is integrally formed with the battery information input terminal, the battery state monitoring unit, the output terminal, and the circuit board so as to accommodate at least the whole battery state monitoring unit and the whole circuit board and expose terminal connecting portions to the outside.

12 Claims, 8 Drawing Sheets

(51) Int. Cl.
  H01M 10/48 (2006.01)
  G01R 1/04 (2006.01)
  G01R 31/396 (2019.01)
  H05K 1/02 (2006.01)
(52) U.S. Cl.
  CPC ......... H01M 10/482 (2013.01); H02J 7/0014 (2013.01); H02J 7/0042 (2013.01); H05K 1/144 (2013.01); H05K 1/148 (2013.01); *G01R 1/04* (2013.01); *G01R 31/396* (2019.01); *H05K 1/0262* (2013.01); *H05K 2201/042* (2013.01)

(56) References Cited

U.S. PATENT DOCUMENTS

| | | |
|---|---|---|
| 8,988,078 B2 | 3/2015 | Kiuchi |
| 2001/0015887 A1 | 8/2001 | Sanada et al. |
| 2008/0030198 A1* | 2/2008 | Kawata ............ G01R 31/3842 324/426 |
| 2011/0199091 A1 | 8/2011 | Tanabe |
| 2012/0306506 A1 | 12/2012 | Kiuchi |
| 2012/0323511 A1 | 12/2012 | Saigo et al. |
| 2013/0338871 A1* | 12/2013 | Kubo .................. H01M 10/48 701/29.2 |
| 2015/0331058 A1 | 11/2015 | Kamata |
| 2017/0125999 A1* | 5/2017 | Yamamoto ............ H02H 3/05 |

FOREIGN PATENT DOCUMENTS

| | | |
|---|---|---|
| JP | 2001237575 A | 8/2001 |
| JP | 2011164008 A | 8/2011 |
| JP | 2012253836 A | 12/2012 |
| JP | 2013-005509 A | 1/2013 |
| JP | 2014072084 A | 4/2014 |
| JP | 2015220813 A | 12/2015 |

* cited by examiner

BATTERY MONITORING DEVICE

CROSS-REFERENCE TO RELATED APPLICATION(S)

The present application claims priority to and incorporates by reference the entire contents of Japanese Patent Application No. 2017-024368 filed in Japan on Feb. 13, 2017.

BACKGROUND OF THE INVENTION

1. Field of the Invention

The present invention relates to a battery monitoring device.

2. Description of the Related Art

Conventional vehicles, such as electric cars, having a rotating machine serving as a driving source for traveling are provided with a high-voltage direct-current (DC) power supply that supplies electric power to the rotating machine (Japanese Patent Application Laid-open No.2013-5509). The DC power supply, for example, is a battery pack including a battery module composed of a plurality of battery cells. This kind of vehicles monitor the battery state of the battery module and are provided with a battery monitoring device that performs the monitoring.

The conventional battery monitoring device is attached to the side surface of the battery module, thereby protruding from the battery module when the battery pack is viewed from the top. The conventional battery monitoring device, for example, accommodates electronic components for battery monitoring and a circuit board in the internal space of a case. As a result, the conventional battery monitoring device protrudes from the battery module by the size of the case.

SUMMARY OF THE INVENTION

The present invention aims to provide a battery monitoring device that can be downsized.

A battery monitoring device according to one aspect of the present invention includes a battery information input terminal that has a terminal connecting portion physically and electrically connected to a counter battery information output terminal of a first counter connector provided to a secondary battery, the battery information input terminal being electrically connected to a battery state detecting member that detects a battery state of the secondary battery via the counter battery information output terminal; a battery state monitoring unit that receives a battery state detection signal indicating the battery state via the battery information input terminal; an output terminal that has a terminal connecting portion physically and electrically connected to a counter input terminal of a second counter connector provided to an external arithmetic processor, the output terminal outputting monitoring information on the battery state corresponding to the battery state detection signal of the battery state monitoring unit to the arithmetic processor; a circuit board provided with the battery information input terminal, the battery state monitoring unit, and the output terminal; and an insulating housing member integrally formed with the battery information input terminal, the battery state monitoring unit, the output terminal, and the circuit board so as to accommodate at least the whole battery state monitoring unit and the whole circuit board and expose the terminal connecting portion of the battery information input terminal and the terminal connection portion of the output terminal to an outside, wherein the housing member has a first connector fitting portion into which the first counter connector is fit and a second connector fitting portion into which the second counter connector is fit, the terminal connecting portion of the battery information input terminal is arranged in the first connector fitting portion in a manner exposed to the outside, and the terminal connecting portion of the output terminal is arranged in the second connector fitting portion in a manner exposed to the outside.

According to another aspect of the present invention, in the battery monitoring device, it is preferable that the circuit board includes a plurality of circuit board bodies each provided with a circuit and arranged in multiple layers with a space interposed between board surfaces.

According to still another aspect of the present invention, it is preferable that the battery monitoring device further includes a controller that performs control on the battery state monitoring unit and cell balance control on a plurality of battery cells included in the secondary battery based on an operating instruction, and transmits the monitoring information to the arithmetic processor; and an input terminal that has a terminal connecting portion physically and electrically connected to a counter output terminal of the second counter connector, the input terminal receiving an operating instruction signal indicating the operating instruction from the arithmetic processor, wherein the terminal connecting portion of the input terminal is arranged in the second connector fitting portion in a manner exposed to the outside.

According to still another aspect of the present invention, in the battery monitoring device, it is preferable that the circuit board includes a plurality of circuit board bodies each provided with a circuit and arranged in multiple layers with a space interposed between board surfaces, a first circuit board body out of two circuit board bodies having the board surfaces facing each other is a high-voltage circuit board body provided with a high-voltage system circuit electrically connected to the secondary battery having a high voltage via the battery information input terminal, a second circuit board body out of the two circuit board bodies having the board surfaces facing each other is a low-voltage circuit board body provided with a low-voltage system circuit electrically connected to an external power supply having a voltage lower than the voltage of the secondary battery, the high-voltage system circuit includes the battery state monitoring unit, and the low-voltage system circuit includes the controller.

According to still another aspect of the present invention, in the battery monitoring device, it is preferable that the circuit board bodies are provided, on the board surfaces facing each other of the circuit board bodies adjacent to each other, with respective electronic components having a height from the board surfaces after being mounted higher than a reference height out of a plurality of types of electronic components constituting the circuits.

According to still another aspect of the present invention, in the battery monitoring device, it is preferable that the circuit board includes a coupler that electrically connects the circuits serving as a target of electrical connection and couples the circuit board bodies including the circuits serving as the target of electrical connection.

According to still another aspect of the present invention, in the battery monitoring device, it is preferable that the coupler has sufficient flexibility to be foldable, couples the circuit board bodies adjacent to each other, and causes the circuit board bodies adjacent to each other to be arranged in multiple layers when the coupler is folded.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of a battery monitoring device according to the present invention are described below in greater detail with reference to the accompanying drawings. The embodiments are not intended to limit the present invention.

Embodiments

One of the embodiments of the battery monitoring device according to the present invention is described with reference to FIGS. 1 to 10.

Figure 1:
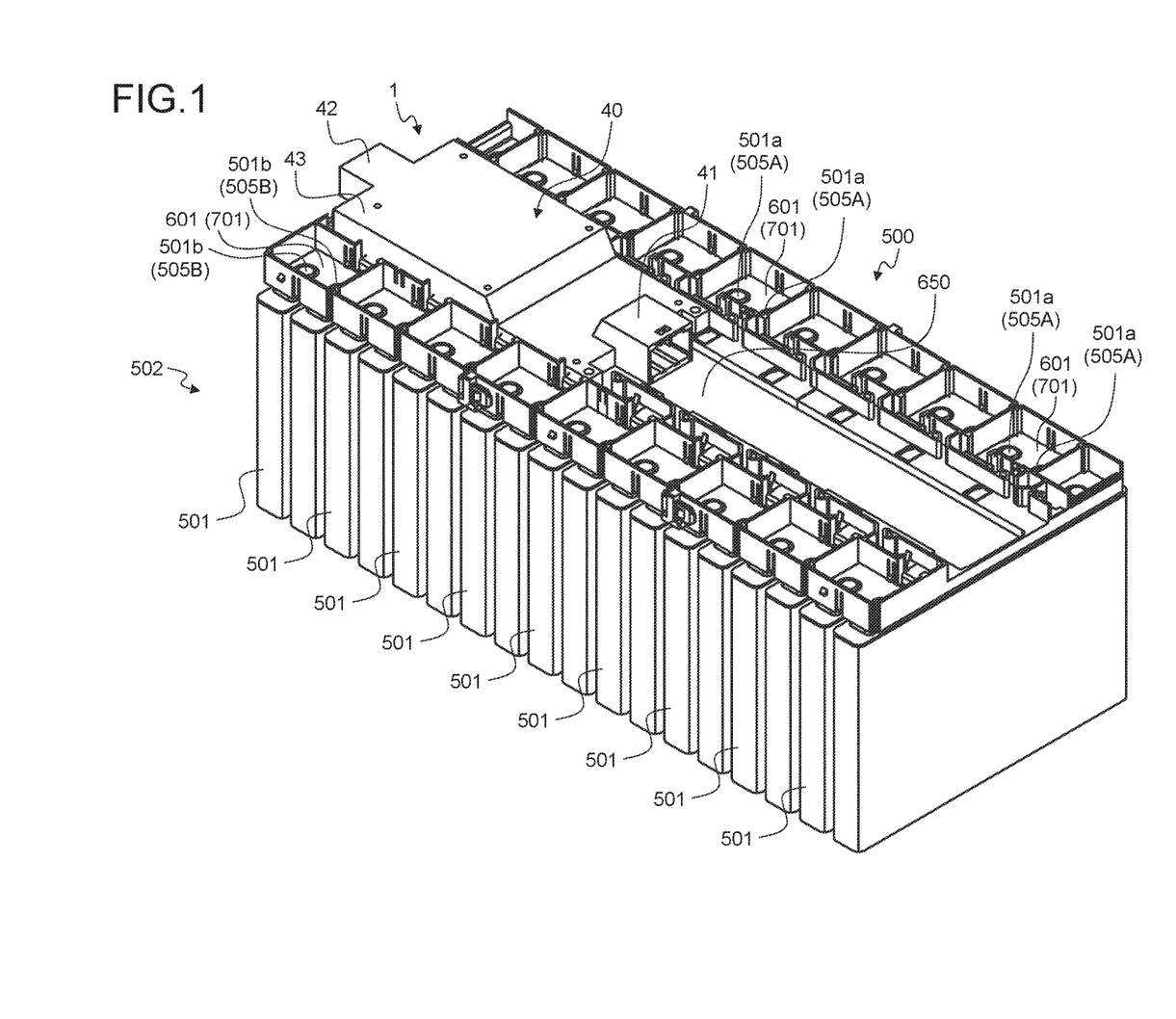
FIG. 1 is a perspective view of a battery monitoring device according to an embodiment of the present invention and a battery module.
Figure 2:
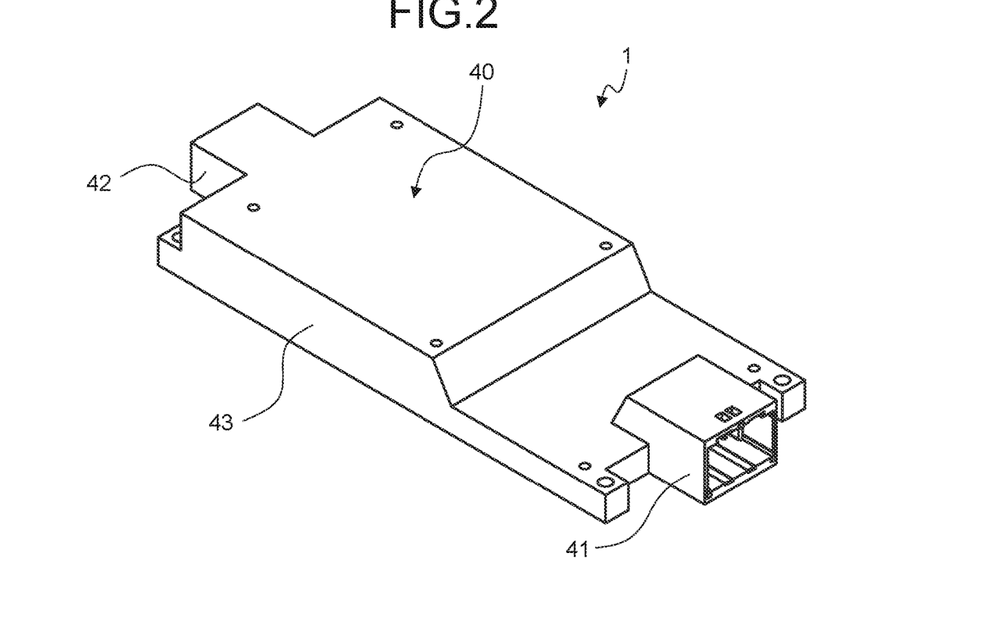
FIG. 2 is a perspective view of the battery monitoring device according to the embodiment.
Figure 3:
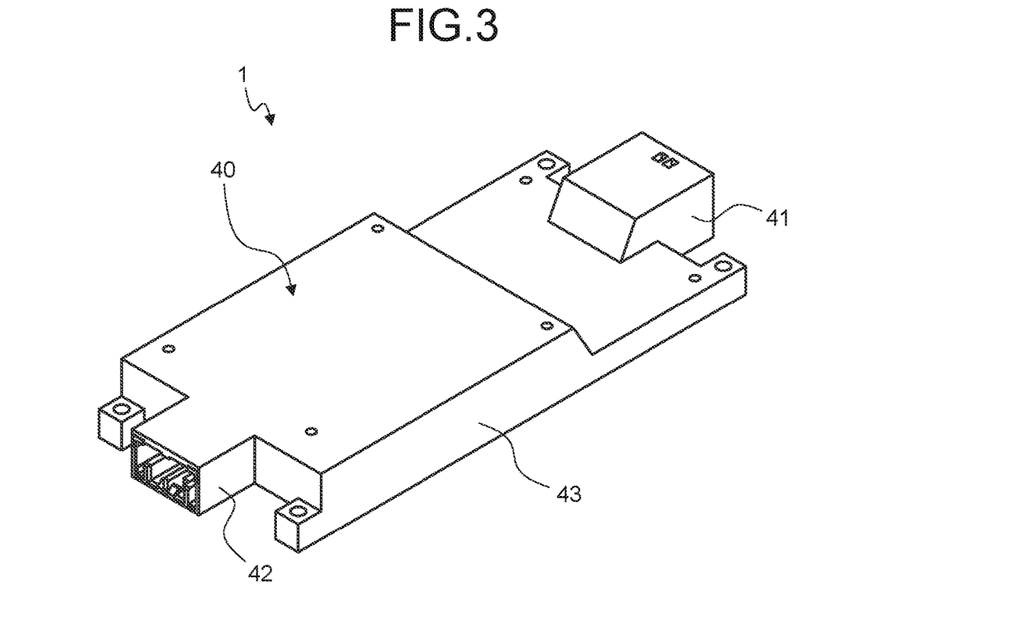
FIG. 3 is a perspective view of the battery monitoring device according to the embodiment viewed from another angle.
Figure 4:
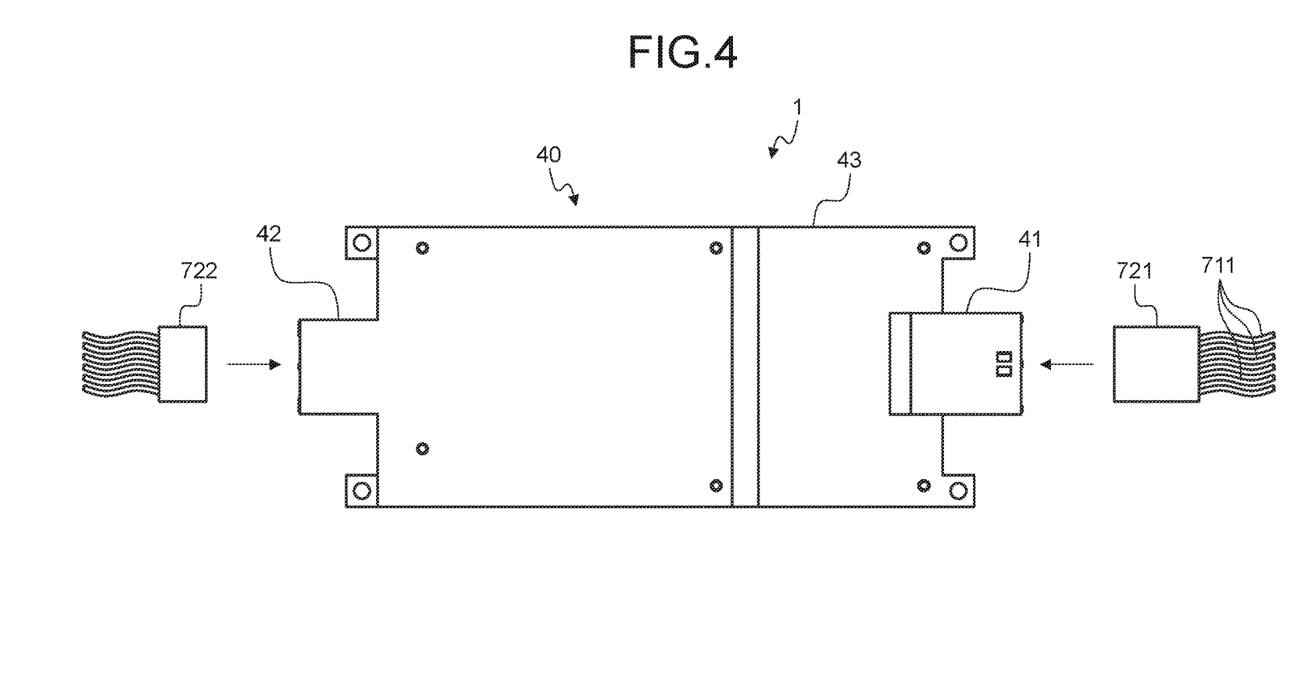
FIG. 4 is a plan view of the battery monitoring device according to the embodiment viewed in a direction orthogonal to a circuit board.

A battery monitoring device according to the present embodiment is denoted by a reference numeral 1 in FIGS. 1 to 8. The battery monitoring device 1 is used for a vehicle (not illustrated), such as an electric car and a hybrid car, having a rotating machine serving as a driving source for traveling. This kind of vehicle is provided with a low-voltage direct-current power supply (hereinafter, referred to as a "DC low-voltage power supply"), which is not illustrated, and a high-voltage direct-current power supply (hereinafter, referred to as a "DC high-voltage power supply") 500 having a voltage higher than that of the DC low-voltage power supply (FIG. 1). The DC low-voltage power supply and the DC high-voltage power supply 500 are secondary batteries. In the vehicle, the DC high-voltage power supply 500 supplies electric power serving as driving energy to the rotating machine and is charged with regenerative energy generated by a generator during braking. The battery monitoring device 1 is provided to the vehicle to increase the reliability of a system that controls braking and driving force. The battery monitoring device 1 monitors the battery state (e.g., the voltage, the electric current, and the temperature) of the DC high-voltage power supply 500.

The DC high-voltage power supply 500 includes a battery module 502 composed of a plurality of battery cells 501 (FIG. 1). The battery module 502 is an aggregate in which the battery cells 501 are stacked. In the battery module 502, first electrode terminals 501a of the respective battery cells 501 serve as first electrode terminal groups 505A aligned in the stacking direction. Second electrode terminals 501b of the respective battery cells 501 serve as second electrode terminal groups 505B aligned in the stacking direction. In the battery module 502, two adjacent electrode terminals 501a and 501a (501b and 501b) are coupled by a conductive bus bar 601 in each electrode terminal group 505A (505B). The battery module 502 and the bus bars 601 constitute a battery pack serving as the DC high-voltage power supply 500.

The DC high-voltage power supply 500 includes battery state detecting members 701 that detect the battery state of the DC high-voltage power supply 500 (FIG. 1). The battery monitoring device 1 according to the present embodiment, for example, monitors the battery state of the battery cells 501. The battery state detecting members 701 are provided to detect the battery state of the respective battery cells 501. The battery state detecting members 701, for example, are made of a conductive member having the same electric potential as that of the electrode terminals 501a and 501b of the battery cells 501. The conductive members may be provided to the respective electrode terminals 501a and 501b of the battery cells 501 and may be the bus bars 601. In this example, the bus bars 601 are used as the battery state detecting members 701. To detect the temperature, temperature sensors are used as the battery state detecting members 701.

The battery state detecting members 701 are physically and electrically connected to signal transmitting members 711 (FIG. 4) having a conductor. The signal transmitting members 711 transmit battery state detection signals indicating the battery state detected by the battery state detecting members 701 to the battery monitoring device 1. The signal transmitting members 711 are provided to the respective battery state detecting members 701. First ends of the conductors of the signal transmitting members 711, for example, are physically and electrically connected to the respective battery state detecting members 701. Second ends of the conductors are physically and electrically connected to conductive terminals (hereinafter, referred to as "counter battery information output terminals"). The counter battery information output terminals (not illustrated) are arranged in a counter connector (hereinafter, referred to as a "first counter connector") 721 (FIG. 4) provided to the DC high-voltage power supply 500. The signal transmitting members 711 are flexible flat conductors, such as electric wires (what is called voltage detection wires) and flexible printed circuits (what is called FPCs).

Figure 5:
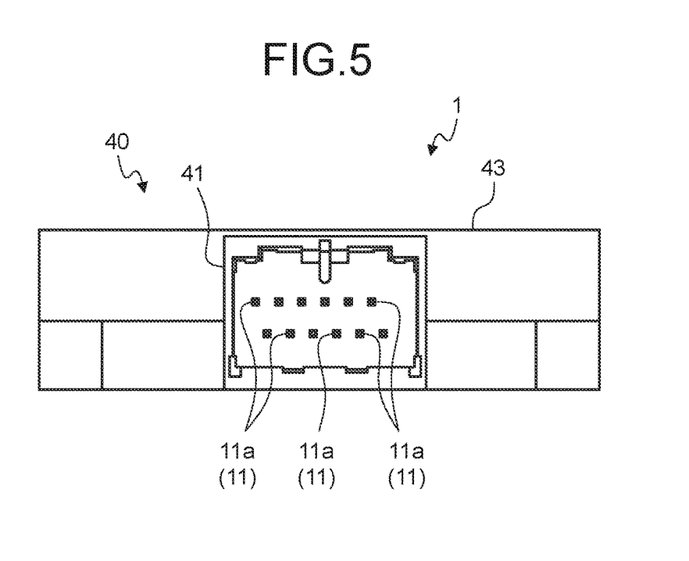
FIG. 5 is a plan view of the battery monitoring device according to the embodiment viewed from a first connector fitting portion side.
Figure 7:
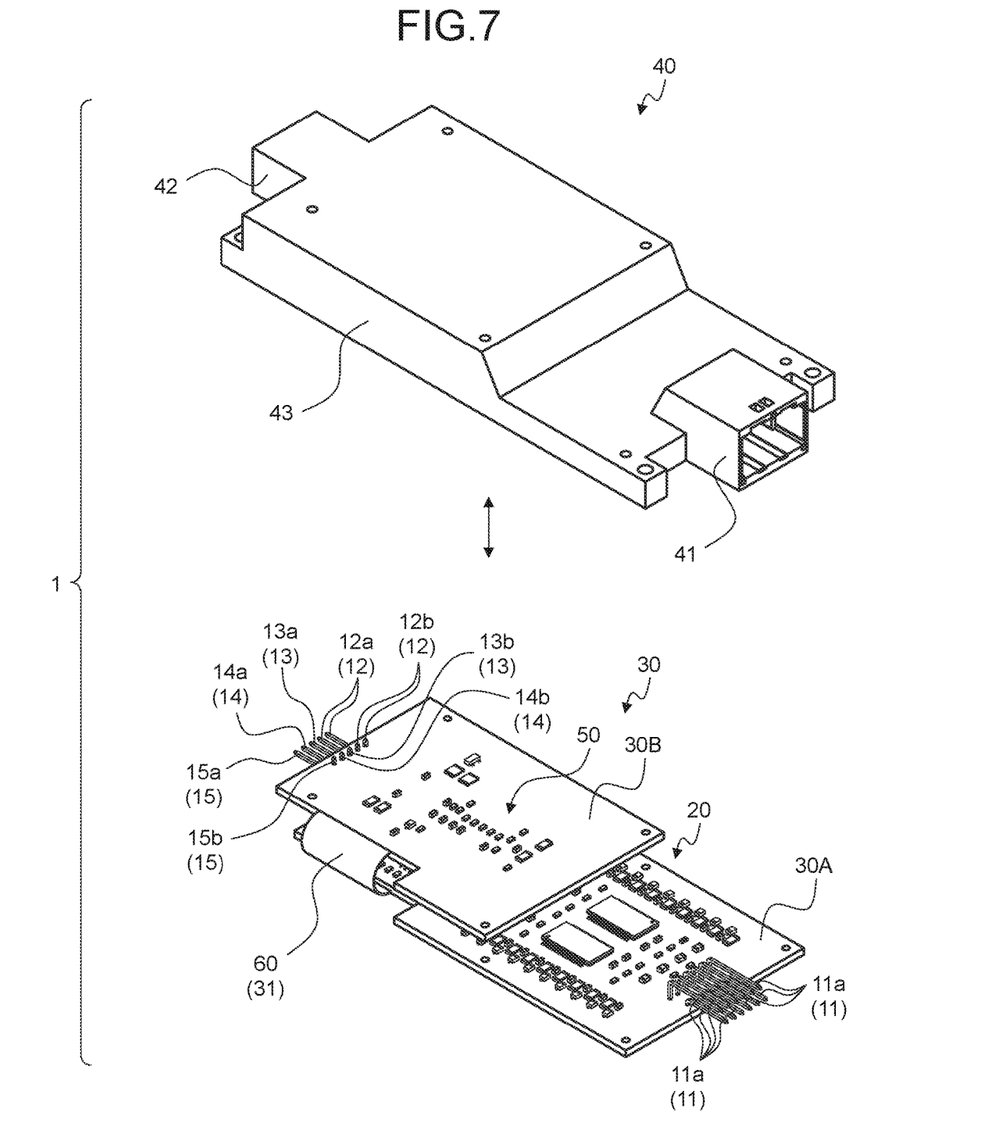
FIG. 7 is an exploded perspective view of the battery monitoring device according to the embodiment.
Figure 8:
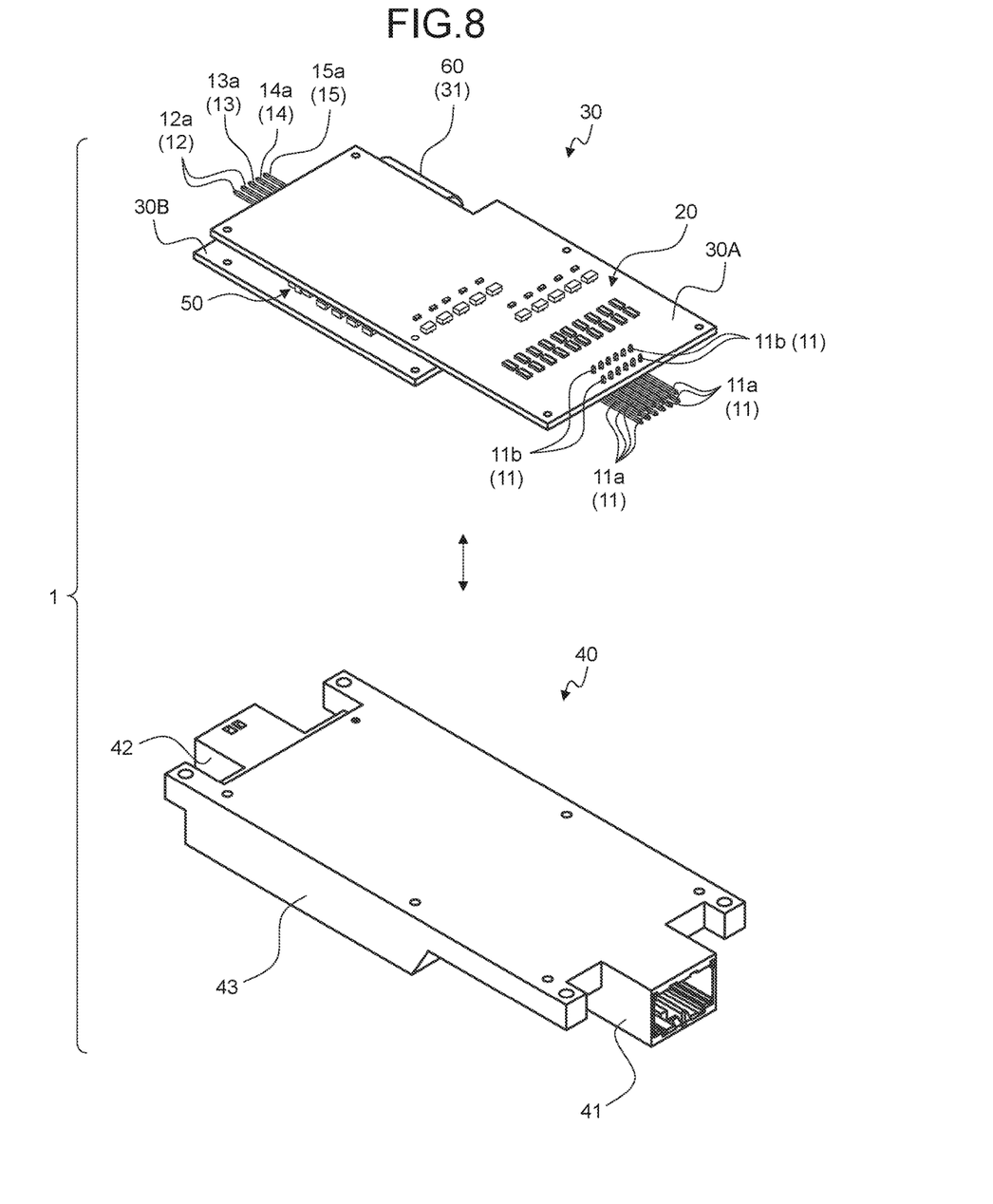
FIG. 8 is an exploded perspective view of the battery monitoring device according to the embodiment viewed from another angle.

The battery monitoring device 1 includes input terminals (hereinafter, referred to as "battery information input terminals") 11 that receive the battery state detection signals (FIGS. 5, 7, and 8). The battery information input terminals 11 are made of a conductive material, such as a metal. The battery information input terminals 11 are provided for the respective counter battery information output terminals in the first counter connector 721 (that is, for the respective battery state detecting members 701). The battery information input terminals 11 are electrically connected to the battery state detecting members 701 via the respective counter battery information output terminals. The battery information input terminals 11 each have a terminal connecting portion 11a physically and electrically connected to the respective counter battery information output terminals (FIGS. 5, 7, and 8). The battery information input terminals 11 each have a board connecting portion 11b attached to a circuit board 30, which will be described later (FIG. 8). The battery information input terminal 11 in this example is a male terminal obtained by bending a linear conductor serving as a base material made of a conductive material, such as a metal, into an L-shape at a predetermined length or punching out an L-shaped piece from a metal plate serving as a base material. In the battery information input terminal 11, one of the extending portions from the L-shaped bend serves as the terminal connecting portion 11a, and the other thereof serves as the board connecting portion 11b. The terminal connecting portion 11a is orthogonal to the board connecting portion 11b. The battery information input terminal 11 is attached to the circuit board 30 by inserting the board connecting portion 11b into a through hole in the circuit board 30 and soldering the board connecting portion 11b with wiring in a circuit pattern of the circuit board 30. The board connecting portion 11b may be a press-fit terminal. Alternatively, the board connecting portion 11b may be a surface-mounting connecting portion and mounted on the surface of the circuit board 30 by reflow soldering with a terminal plate interposed therebetween.

The battery monitoring device 1 includes a battery state monitoring unit 20 that receives the battery state detection signals via the battery information input terminals 11 (FIGS. 7 and 8). The battery state monitoring unit 20 includes battery monitoring integrated circuits (what is called battery monitoring ICs), for example. The battery state monitoring unit 20 includes the battery monitoring integrated circuits for the respective battery state detecting members 701. The battery state monitoring unit 20, for example, is a circuit including a plurality of electronic components, such as the battery monitoring integrated circuits and a capacitor, and wiring in the circuit pattern of the circuit board 30.

Figure 6:
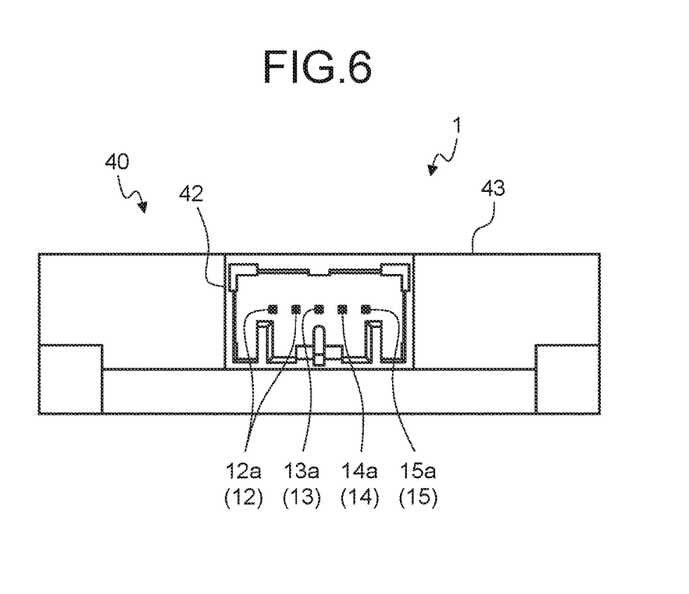
FIG. 6 is a plan view of the battery monitoring device according to the embodiment viewed from a second connector fitting portion side.

The battery monitoring device 1 outputs monitoring information on the battery state corresponding to the battery state detection signals of the battery state monitoring unit 20 to an external arithmetic processor (not illustrated). The external arithmetic processor is a host arithmetic processor provided to the vehicle, for example. The external arithmetic processor, for example, is an arithmetic processor (e.g., a main ECU) that performs traveling control, such as braking and driving control. In this example, the battery monitoring device 1 outputs the battery state detection signals received from the battery state monitoring unit 20 to the external arithmetic processor as the monitoring information. The battery monitoring device 1 includes output terminals 12 that output the monitoring information to the external arithmetic processor (FIGS. 6 to 8).

The output terminal 12 is made of a conductive material, such as a metal. Similarly to the battery information input terminal 11, the output terminal 12 in this example is a male terminal obtained by bending a linear conductor serving as a base material made of a conductive material, such as a metal, into an L-shape at a predetermined length or punching out an L-shaped piece from a metal plate serving as a base material. In the output terminal 12, one of the extending portions from the L-shaped bend serves as a terminal connecting portion 12a (FIGS. 6 and 7), and the other thereof serves as a board connecting portion 12b (FIG. 7). The terminal connecting portion 12a is orthogonal to the board connecting portion 12b.

The external arithmetic processor, which is not illustrated, is provided with a counter connector (hereinafter, referred to as a "second counter connector") 722 (FIG. 4) different from the first counter connector 721. The battery monitoring device 1 is electrically connected to the external arithmetic processor via the second counter connector 722. The terminal connecting portion 12a is physically and electrically connected to a counter input terminal of the second counter connector 722. The board connecting portion 12b is inserted into a through hole in the circuit board 30 and soldered with wiring in the circuit pattern of the circuit board 30, thereby being attached to the circuit board 30. The board connecting portion 12b may be a press-fit terminal. Alternatively, the board connecting portion 12b may be a surface-mounting connecting portion and mounted on the surface of the circuit board 30 by reflow soldering with a terminal plate interposed therebetween.

The battery monitoring device 1 includes the circuit board 30 provided with the battery information input terminals 11, the battery state monitoring unit 20, and the output terminals 12 (FIGS. 7 and 8). The battery monitoring device 1 further includes an insulating housing member 40 made of an insulating material, such as a synthetic resin (FIGS. 1 to 8). The housing member 40 is integrally formed with the battery information input terminals 11, the battery state monitoring unit 20, the output terminals 12, and the circuit board 30. The housing member 40 is provided so as to accommodate at least the whole battery state monitoring unit 20 and the whole circuit board 30 and expose the terminal connecting portions 11a and 12a of the battery information input terminals 11 and the output terminals 12, respectively, to the outside.

The battery monitoring device 1 is downsized with the integrally formed housing member 40. The battery monitoring device 1 has a first connector fitting portion 41 (FIGS. 1 to 5, 7, and 8) and a second connector fitting portion 42 (FIGS. 1 to 4 and 6 to 8) in the housing member 40 so as to facilitate its connecting the battery module 502 to the external arithmetic processor. The first connector fitting portion 41 is a portion into which the first counter connector 721 provided to the DC high-voltage power supply 500 is fit. The second connector fitting portion 42 is a portion into which the second counter connector 722 provided to the external arithmetic processor is fit. The terminal connecting portions 11a of the battery information input terminals 11 are arranged in the first connector fitting portion 41 in a manner exposed to the outside (FIG. 5). The terminal connecting portions 12a of the output terminals 12 are arranged in the second connector fitting portion 42 in a manner exposed to the outside (FIG. 6).

The following describes the battery monitoring device 1 more specifically.

As described above, the battery monitoring device 1 may simply need to transmit the battery state detection signals serving as the monitoring information to the external arithmetic processor. In this case, for example, the arithmetic processor issues operating instructions to control the battery state monitoring unit 20, thereby causing the battery state monitoring unit 20 to transmit its battery state detection signals to the arithmetic processor. To perform the control, the second counter connector 722 of the arithmetic processor includes a counter output terminal (not illustrated) that outputs operating instruction signals indicating the operating instructions. The battery monitoring device 1 includes an input terminal 13 that receives the operating instruction signals from the arithmetic processor (FIGS. 6 to 8).

The input terminal 13 is made of a conductive material, such as a metal. Similarly to the battery information input terminal 11 and other terminals, the input terminal 13 in this example is a male terminal obtained by bending a linear conductor serving as a base material made of a conductive material, such as a metal, into an L-shape at a predetermined length or punching out an L-shaped piece from a metal plate serving as a base material. In the input terminal 13, one of the extending portions from the L-shaped bend serves as a terminal connecting portion 13a (FIGS. 6 to 8), and the other thereof serves as a board connecting portion 13b (FIG. 7). The terminal connecting portion 13a is orthogonal to the board connecting portion 13b. The terminal connecting portion 13a is physically and electrically connected to the counter output terminal of the second counter connector 722. The terminal connecting portion 13a is arranged in the second connector fitting portion 42 in a manner exposed to the outside (FIG. 6). The board connecting portion 13b is inserted into a through hole in the circuit board 30 and soldered with wiring in the circuit pattern of the circuit board 30, thereby being attached to the circuit board 30. The board connecting portion 13b may be a press-fit terminal. Alternatively, the board connecting portion 13b may be a surface-mounting connecting portion and mounted on the surface of the circuit board 30 by reflow soldering with a terminal plate interposed therebetween.

The battery monitoring device 1 may include a controller 50 that operates based on the operating instructions received from the external arithmetic processor (FIGS. 7 and 8). The operating instructions from the arithmetic processor are received via the input terminal 13. The controller 50, for example, controls the battery state monitoring unit 20 based on the operating instructions received from the arithmetic processor, thereby causing the battery state monitoring unit 20 to transmit its battery state detection signals to the controller 50. The battery monitoring device 1 includes a communication unit 60 that transmits and receives signals between the battery state monitoring unit 20 and the controller 50 (FIGS. 7 and 8). The communication unit 60 may be a wired or wireless unit. The controller 50 performs control (what is called cell balance control) for making the voltage and the capacitance of the battery cells 501 uniform based on the operating instructions received from the arithmetic processor. The controller 50 receives the battery state detection signals and control information on the cell balance control (e.g., control results of the cell balance control) and transmits them to the external arithmetic processor via the output terminals 12 as the monitoring information. The controller 50, for example, is a circuit including a plurality of electronic components, such as a capacitor, and wiring in the circuit pattern of the circuit board 30.

The circuit board 30 may be a single-layer circuit board. Alternatively, the circuit board 30 may be a multilayer circuit board including a plurality of circuit board bodies each provided with a circuit and arranged in multiple layers with a space interposed between their planes (their board surfaces). The circuit board 30 according to the present embodiment, for example, has the latter configuration in which a plurality of circuit board bodies are arranged one by one in multiple layers. The circuit board bodies are provided such that adjacent circuit board bodies are arranged with their board surfaces facing each other. The circuit board bodies may be provided with respective different types of circuits. Alternatively, a single circuit board body may be provided with different types of circuits. In the circuit board bodies, for example, one of two circuit board bodies having their board surfaces facing each other is provided with a circuit of a high-voltage system (high-voltage system circuit), and the other thereof is provided with a circuit of a low-voltage system (low-voltage system circuit). The circuit board bodies are preferably provided with electronic components having a height from the board surface after being mounted higher than a reference height out of a plurality of types of electronic components constituting the circuits on the facing board surfaces of the adjacent circuit board bodies. The reference height may be set to a multiple of the height of an electronic component having the lowest height from the board surface, for example.

The circuit board 30 in this example includes two circuit board bodies having their board surfaces facing each other, that is, a first circuit board body 30A and a second circuit board body 30B (FIGS. 7 and 8).

The first circuit board body 30A is a high-voltage circuit board body provided with the high-voltage system circuit electrically connected to the DC high-voltage power supply 500 via the battery information input terminals 11. The high-voltage system circuit includes the circuit pattern and the battery state monitoring unit 20 provided on the board surface of the first circuit board body 30A. The battery information input terminals 11 are mounted on the first circuit board body 30A.

The battery information input terminals 11 are attached to the first circuit board body 30A with a space interposed therebetween. The battery information input terminals 11 are provided such that they are arranged on one side of the rectangular first circuit board body 30A of the circuit board 30 and that the terminal connecting portions 11a are arranged on one of the board surfaces of the first circuit board body 30A. The battery information input terminals 11 are attached to the first circuit board body 30A such that the extending directions of the respective board connecting portions 11b coincide with the direction orthogonal to the board surface of the first circuit board body 30A and that protruding directions of the respective terminal connecting portions 11a toward the free ends are aligned in the same direction (FIG. 7). With this configuration, the terminal connecting portions 11a extend in the same direction along the board of the first circuit board body 30A. The connection directions of the terminal connecting portions 11a to the respective counter battery information output terminals are the same.

The second circuit board body 30B is a low-voltage circuit board body provided with the low-voltage system circuit electrically connected to an external power supply (DC low-voltage power supply) having a voltage lower than that of the DC high-voltage power supply 500. The present embodiment uses electric power of the DC low-voltage power supply to operate the controller 50, and the low-voltage system circuit includes the controller 50. The low-voltage system circuit also includes the circuit pattern provided to the board surface of the second circuit board body 30B. The electric power of the DC low-voltage power supply can be supplied from the external arithmetic processor. To receive the electric power, the battery monitoring device 1 includes a power supply terminal 14 and a ground terminal 15 (FIGS. 6 to 8).

The power supply terminal 14 and the ground terminal 15 are made of a conductive material, such as a metal. Similarly to the battery information input terminal 11 and other terminals, the power supply terminal 14 and the ground terminal 15 in this example are male terminals obtained by bending a linear conductor serving as a base material made of a conductive material, such as a metal, into an L-shape at a predetermined length or punching out an L-shaped piece from a metal plate serving as a base material. In the power supply terminal 14 and the ground terminal 15, one of the extending portions from the L-shaped bend serves as terminal connecting portions 14a and 15a (FIGS. 6 to 8), and the other thereof serves as board connecting portions 14b and 15b (FIG. 7). The terminal connecting portions 14a and 15a are orthogonal to the board connecting portions 14b and 15b, respectively. The terminal connecting portion 14a is physically and electrically connected to a counter power supply terminal of the second counter connector 722. The terminal connecting portion 15a is physically and electrically connected to a counter ground terminal of the second counter connector 722. The terminal connecting portion 14a of the power supply terminal 14 and the terminal connecting portion 15a of the ground terminal 15 are arranged in the second connector fitting portion 42 in a manner exposed to the outside (FIG. 6). The board connecting portions 14b and 15b are inserted into respective through holes in the circuit board 30 and soldered with wiring in the circuit pattern of the circuit board 30, thereby being attached to the circuit board 30. The power supply terminal 14 and the ground terminal 15 are mounted on the second circuit board body 30B together with the output terminals 12 and the input terminal 13. The board connecting portions 14b and 15b may be press-fit terminals. Alternatively, the board connecting portions 14b and 15b may be surface-mounting connecting portions and mounted on the surface of the circuit board 30 by reflow soldering with a terminal plate interposed therebetween.

The output terminals 12, the input terminal 13, the power supply terminal 14, and the ground terminal 15 are attached to the second circuit board body 30B with a space interposed therebetween. The output terminals 12, the input terminal 13, the power supply terminal 14, and the ground terminal 15 are provided such that they are arranged on one side of the rectangular second circuit board body 30B of the circuit board 30 and that the terminal connecting portions 12a, 13a, 14a, and 15a are arranged on one of the board surfaces of the second circuit board body 30B. The output terminals 12, the input terminal 13, the power supply terminal 14, and the ground terminal 15 are attached to the second circuit board body 30B such that the extending directions of the respective board connecting portions 12b, 13b, 14b, and 15b coincide with the direction orthogonal to the board surface of the second circuit board body 30B and that protruding directions of the respective terminal connecting portions 12a, 13a, 14a, and 15a toward the free ends are aligned in the same direction (FIG. 7).

With this configuration, the terminal connecting portions 12a, 13a, 14a, and 15a extend in the same direction along the board surface of the second circuit board body 30B. The connection directions of the terminal connecting portions 12a, 13a, 14a, and 15a to the respective counter battery information output terminals are the same. The terminal connecting portions 12a, 13a, 14a, and 15a in this example protrude in a direction opposite to the protruding direction of the terminal connecting portions 11a of the battery information input terminals 11. Consequently, the output terminals 12, the input terminal 13, the power supply terminal 14, and the ground terminal 15 in this example are arranged on the second circuit board body 30B on a side opposite to the side provided with the battery information input terminals 11.

In the housing member 40, the first connector fitting portion 41 and the second connector fitting portion 42 are arranged in correspondence with the arrangement of the battery information input terminals 11, the output terminals 12, the input terminal 13, the power supply terminal 14, and the ground terminal 15. In the housing member 40, the first connector fitting portion 41 and the second connector fitting portion 42 in this example protrude from a main body 43 in directions along the board surface of the circuit board 30 (the first circuit board body 30A and the second circuit board body 30B), thereby suppressing its protrusion in the direction orthogonal to the board surface. With this structure, the battery monitoring device 1 can suppress an increase in size in the orthogonal direction caused by the multilayer structure of the circuit board 30.

The circuit board 30 may include a coupler that electrically connects circuits serving as a target of electrical connection and couples circuit board bodies including the circuits serving as the target of electrical connection. The coupler includes the communication unit 60. The communication unit 60 electrically connects the battery state monitoring unit 20 in the high-voltage system circuit to the controller 50 in the low-voltage system circuit. The coupler may be a separate body attached to the circuit board bodies or integrally formed with the circuit board bodies. Examples of the separate coupler may include, but are not limited to a hybrid IC. The coupler preferably has sufficient flexibility to be folded and couples adjacent circuit board bodies. The adjacent circuit board bodies can be arranged in multiple layers by folding the coupler. In a case where a separate coupler is used, for example, the coupler simply needs to physically and electrically couple the two circuit board bodies and may be a flexible flat conductor (e.g., a flexible printed circuit board and a flat cable), an electric wire, a jumper connector, or a coupling terminal, for example. The flat conductor does not necessarily have flexibility.

Figure 9:
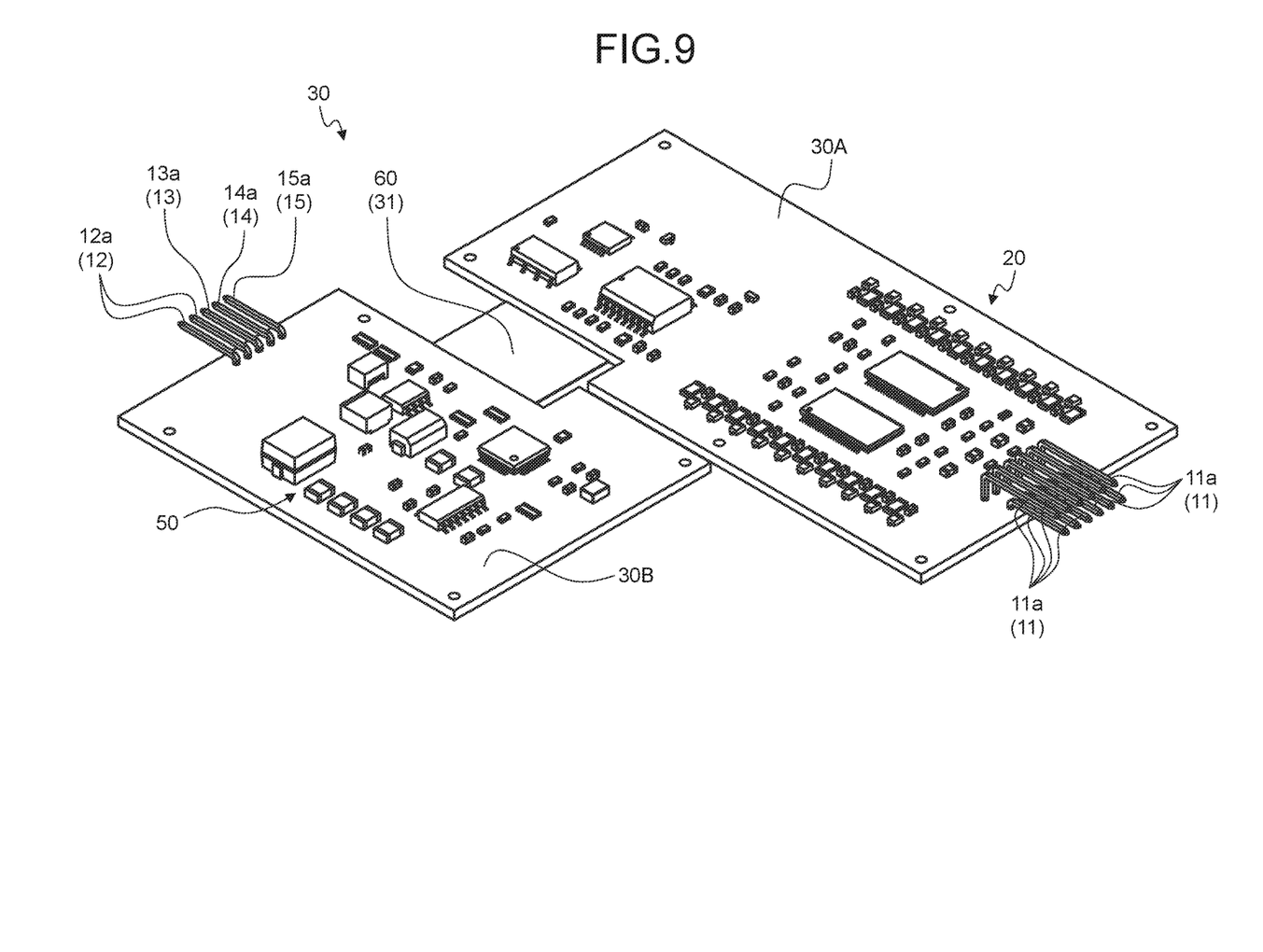
FIG. 9 is a perspective view of the circuit board before being folded.

The circuit board 30 in this example includes a flexible coupler 31 that couples the first circuit board body 30A and the second circuit board body 30B. The circuit board 30 is a rigid flexible board in which the components described above are integrally formed. The circuit board 30, for example, is provided as a single-layer circuit board composed of a plurality of layers including a portion serving as the first circuit board body 30A, a portion serving as the second circuit board body 30B, and a portion serving as the coupler 31. The circuit board 30 is processed and formed such that only a single layer serving as the coupler 31 (layer provided with the circuit pattern serving as the communication unit 60) is left at the portion serving as the coupler 31 (FIG. 9). The portion serving as the coupler 31 is subjected to spot-facing, for example, thereby leaving only the single flexible layer serving as the coupler 31. By folding the flexible coupler 31, the circuit board 30 has a two-layer structure including the first circuit board body 30A and the second circuit board body 30B.

Figure 10:
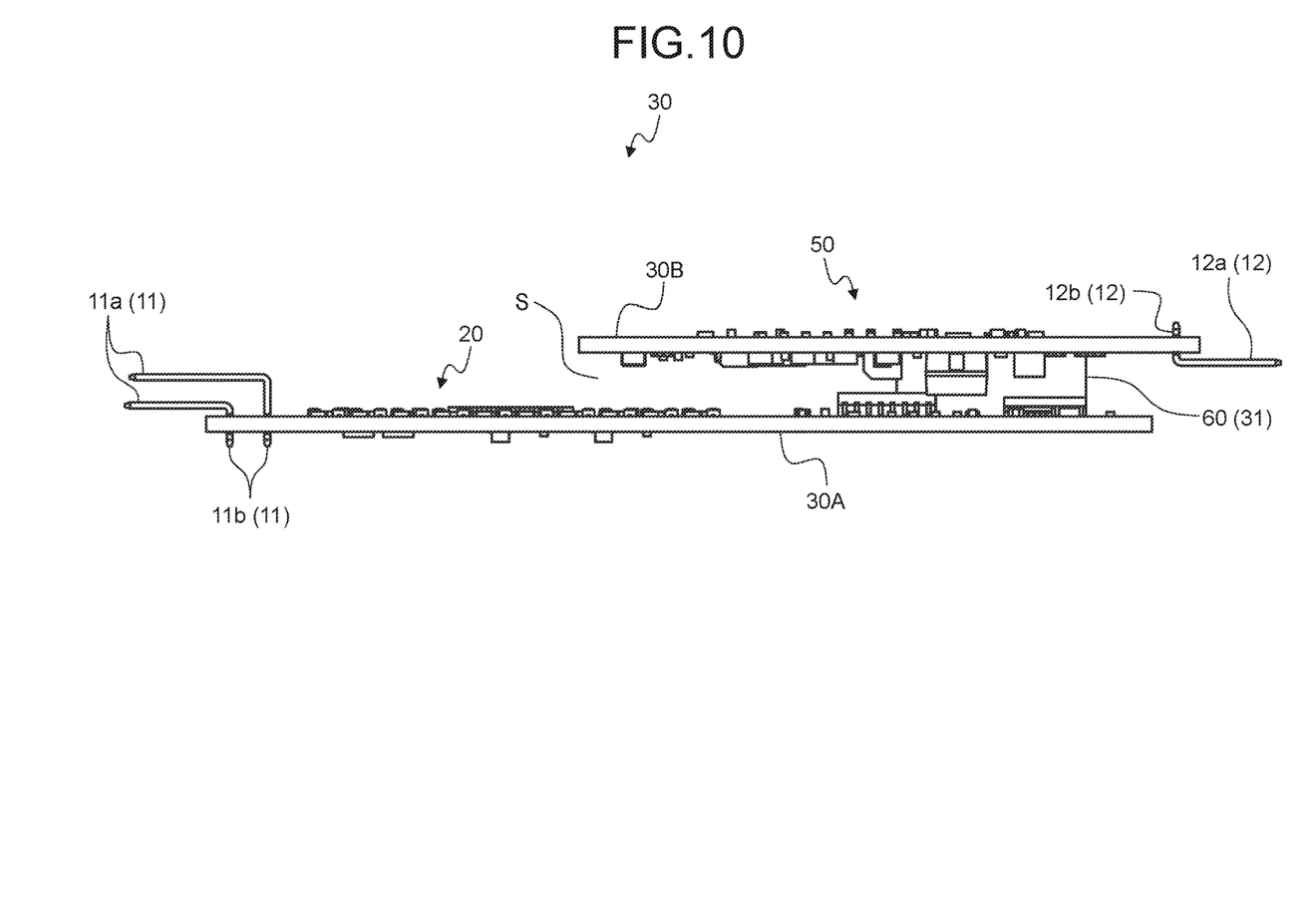
FIG. 10 is a perspective view of the circuit board after being folded.

The first circuit board body 30A and the second circuit board body 30B coupled with the coupler 31 have a space S between their board surfaces facing each other (FIG. 10). The board surface of the first circuit board body 30A on the space side is provided with electronic components having a height from the board surface after being mounted higher than a reference height out of a plurality of types of electronic components constituting the high-voltage system circuit (battery state monitoring unit 20). With this configuration, the circuit board 30 including the high-voltage system circuit can be downsized. The board surface of the second circuit board body 30B on the space side is provided with electronic components having a height from the board surface after being mounted higher than a reference height out of a plurality of types of electronic components constituting the low-voltage system circuit (controller 50). With this configuration, the circuit board 30 including the low-voltage system circuit can be downsized. With the arrangement of the electronic components described above, the battery monitoring device 1 can suppress an increase in size in the orthogonal direction caused by the multilayer structure of the circuit board 30.

The housing member 40 in this example is integrally formed with the battery information input terminals 11, the battery state monitoring unit 20, the output terminals 12, the input terminal 13, the power supply terminal 14, the ground terminal 15, and the circuit board 30. The housing member 40 is provided so as to accommodate the circuit board 30, the high-voltage system circuit (battery state monitoring unit 20), and the low-voltage system circuit (controller 50) and expose the terminal connecting portions 11a, 12a, 13a, 14a, and 15a of the battery information input terminals 11, the output terminals 12, the input terminal 13, the power supply terminal 14, and the ground terminal 15, respectively, to the outside. The housing member 40 covers the circuit board 30, the high-voltage system circuit (battery state monitoring unit 20), and the low-voltage system circuit (controller 50) in a closely contact state. With this structure, the housing member 40 in the battery monitoring device 1 can suppress contact of gas and liquid and entering of extraneous materials to the circuit board 30, the high-voltage system circuit (battery state monitoring unit 20), and the low-voltage system circuit (controller 50). Consequently, the battery monitoring device 1 can improve the protective function for the components described above, thereby increasing its durability. In addition, the integrally formed housing member 40 in the battery monitoring device 1 can secure electrical insulation between the high-voltage system circuit (battery state monitoring unit 20) and the low-voltage system circuit (controller 50). Furthermore, the integrally formed housing member 40 in the battery monitoring device 1 can reduce thermal resistance. Consequently, the battery monitoring device 1 can improve its heat radiation performance for heat (e.g., heat of discharge resistance in sell balance control) generated in the circuit board 30, the high-voltage system circuit (battery state monitoring unit 20), and the low-voltage system circuit (controller 50), thereby increasing its durability.

The housing member 40 is integrally formed with the circuit board 30 so as to cover the board connecting portions 11b, 12b, 13b, 14b, and 15b of the battery information input terminals 11, the output terminals 12, the input terminal 13, the power supply terminal 14, and the ground terminal 15 each having an L-shape. With this structure, the housing member 40 receives force applied to the board connecting portions lib, 12b, 13b, 14b, and 15b when the first counter connector 721 and the second counter connector 722 are pulled out. As a result, the housing member 40 can reduce a load applied to the connections between the board connecting portions 11b, 12b, 13b, 14b, and 15b and the circuit board 30. When an external input is received, the housing member 40 can reduce a load applied to the connections between the board connecting portions 11b, 12b, 13b, 14b, and 15b and the circuit board 30. Examples of the external input may include, but are not limited to, force transmitted from the car body, such as a road surface input, force applied by vibrations generated when the vehicle is travelling, etc. In a case where the battery monitoring device 1 is mounted on a battery of a vehicle, such as an electric car, having a rotating machine serving as a driving source, force applied from the mounting point or the like in association with thermal expansion and thermal contraction of the battery is also received as an external input to the housing member 40. With the effect of reducing a load described above, the battery monitoring device 1 can maintain physical and electrical connection between the board connecting portions 11b, 12b, 13b, 14b, and 15b and the circuit board 30 when it is mounted or used, for example. Consequently, the battery monitoring device 1 can increase its durability.

Because the housing member 40 is integrally formed with the circuit board 30 and other components, it does not require spaces between the case, which is a conventional housing member, and the circuit board and other component. In addition, the housing member 40 does not require collars or fixing members required in the conventional housing member to attach the circuit board and other components to the case. With this configuration, the housing member 40 can be downsized, resulting in downsizing of the battery monitoring device 1. With the integrally formed housing member 40, the battery monitoring device 1 can suppress an increase in size in the orthogonal direction caused by the multilayer structure of the circuit board 30. With the integrally formed housing member 40, gaps (insulation distances) between the wires in the circuit pattern of the circuit board 30 can be reduced. Consequently, the circuit pattern can be reduced in size, resulting in downsizing of the circuit board 30. With the housing member 40 integrally formed according to the size of the circuit board 30 and other components, the battery monitoring device 1 can be downsized. This configuration can reduce spaces (what is called insulation distances) between the wires in the circuit pattern at the connections of the respective terminal connecting portions 11a and spaces (insulation distances) between the wires in the circuit pattern at the terminal connecting portions 12a, 13a, 14a, and 15a in the circuit board 30. Consequently, the circuit board 30 can be downsized, resulting in downsizing of the battery monitoring device 1.

In the battery monitoring device 1, the housing member 40 has the first connector fitting portion 41 and the second connector fitting portion 42. With this structure, the battery monitoring device 1 can be downsized in the direction orthogonal to the board surface of the circuit board 30 compared with a conventional battery monitoring device in which the housing member 40 and the parts (e.g., the circuit board 30) accommodated in the housing member 40 serving as separate bodies are attached to be integrated. If the battery monitoring device 1 can be as large as the conventional battery monitoring device in the orthogonal direction, the electronic components can be mounted on both surfaces of the circuit board 30, for example. As a result, the battery monitoring device 1 can be downsized in the direction along the plane of the circuit board 30.

The battery monitoring device 1 having the configuration described above is mounted on the DC high-voltage power supply 500, for example. The mounting position may be the side surface of the DC high-voltage power supply 500 like the conventional battery monitoring device. In the battery monitoring device 1 in this example, the circuit board 30 is a multilayer circuit board including a plurality of circuit board bodies (the first circuit board body 30A and the second circuit board body 30B). The area of the circuit board 30 viewed in the direction orthogonal to the board surfaces of the circuit board bodies is smaller than that of a single-layer circuit board. As a result, the battery monitoring device 1 is downsized when viewed in the direction described above. As described above, the battery monitoring device 1 can be downsized as a whole with the integrally formed housing member 40. Consequently, the battery monitoring device 1 in this example can be arranged in a space between the two electrode terminal groups 505A and 505B in the battery module 502 (FIG. 1). The battery monitoring device 1 is attached to a supporting member 650 of the bus bars 601. A supporting mechanism (not illustrated), for example, is provided between the battery monitoring device 1 and the supporting member 650 to support them. The supporting mechanism is a locking mechanism, for example, and includes a first engaging portion having a claw and a second engaging portion with which the claw engages.

As described above, the battery monitoring device 1 can be downsized with the housing member 40 integrally formed with the circuit board 30 and other components. This configuration increases the flexibility in selecting the mounting position of the battery monitoring device 1. Downsizing of the battery monitoring device 1 can reduce its weight. The housing member 40 of the battery monitoring device 1 has the first connector fitting portion 41 and the second connector fitting portion 42 and is designed like a connector. With this structure, the battery monitoring device 1 can be mounted not only on the DC high-voltage power supply 500 but also on a car body or an electrical connection box or on a vehicle arithmetic processor. Consequently, the flexibility of the battery monitoring device 1 in the mounting position increases, thereby enabling standardization of the parts. The battery monitoring device 1, for example, is attached to the supporting member 650 with the supporting mechanism, thereby reducing the number of attachment points to the DC high-voltage power supply 500. As a result, the battery monitoring device 1 requires no collar or no fixing member or can reduce the number of them required in the conventional battery monitoring device when being attached to the DC high-voltage power supply 500. Consequently, the battery monitoring device 1 has high flexibility in its mounting position. With the integrally formed housing member 40, the battery monitoring device 1 does not require conventional moisture-proof agents covering the battery state monitoring unit and the controller. Consequently, the battery monitoring device 1 can be reduced in size and weight, thereby increasing the flexibility in its mounting position.

While the battery information input terminals 11, the output terminals 12, the input terminal 13, the power supply terminal 14, and the ground terminal 15 in the battery monitoring device 1 according to the present embodiment are formed into an L-shape, for example, they do not necessarily have the shape. The battery information input terminals 11, the output terminals 12, the input terminal 13, the power supply terminal 14, and the ground terminal 15 may be formed into a linear shape, for example, and attached in a direction orthogonal to the plane of the circuit board 30.

In the battery monitoring device 1 according to the present embodiment, part of the housing member 40 serves as the first connector fitting portion 41 and the second connector fitting portion 42. The first connector fitting portion 41 and the second connector fitting portion 42 are exposed to the outside. Alternatively, the first connector fitting portion 41 and the second connector fitting portion 42 may be formed in the main body 43 of the housing member 40 as follows: a part of the insertion ports (insertion ports for the first counter connector 721 and the second counter connector 722) of the first connector fitting portion 41 and the second connector fitting portion 42, respectively, may protrude outward from the outer wall surfaces of the main body 43 of the housing member 40, and the other part thereof may be recessed inward in the main body 43 of the housing member 40. Also in this case, the inner space of the first connector fitting portion 41 communicates with the outside of the housing member 40, and the terminal connecting portions 11b arranged in the inner space are exposed to the outside. The inner space of the second connector fitting portion 42 communicates with the outside of the housing member 40, and the terminal connecting portions 12b, 13b, 14b, and 15b arranged in the inner space are exposed to the outside. The whole part of the first connector fitting portion 41 and the second connector fitting portion 42 may be recessed inward in the main body 43 of the housing member 40. Also in this case, the inner space of the first connector fitting portion 41 communicates with the outside of the housing member 40, and the terminal connecting portions 11b arranged in the inner space are exposed to the outside. The inner space of the second connector fitting portion 42 communicates with the outside of the housing member 40, and the terminal connecting portions 12b, 13b, 14b, and 15b arranged in the inner space are exposed to the outside. In this case, the housing member 40 has two openings on the outer wall surfaces of the main body 43, for example. The first connector fitting portion 41 and the second connector fitting portion 42 are formed inside the respective openings. The openings are thus used as the insertion ports for the first counter connector 721 and the second counter connector 722.

In the battery monitoring device according to the present embodiment, the housing member is integrally formed so as to accommodate at least the whole battery state monitoring unit and the whole circuit board. The housing member covers the whole battery state monitoring unit and the whole circuit board in a closely contact state. With this structure, the housing member can suppress contact of gas and liquid and entering of extraneous materials to the battery state monitoring unit and the circuit board. In the circuit board, for example, gaps (insulation distances) between the wires in the circuit pattern can be reduced. Consequently, the circuit pattern can be reduced in size, resulting in downsizing of the circuit board.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A battery monitoring device comprising:
  a battery information input terminal that has a terminal connecting portion physically and electrically connected to a counter battery information output terminal of a first counter connector provided to a secondary battery, the battery information input terminal being electrically connected to a battery state detecting member that detects a battery state of the secondary battery via the counter battery information output terminal;
  a battery state monitoring unit that receives a battery state detection signal indicating the battery state via the battery information input terminal;
  an output terminal that has a terminal connecting portion physically and electrically connected to a counter input terminal of a second counter connector provided to an external arithmetic processor, the output terminal outputting monitoring information on the battery state corresponding to the battery state detection signal of the battery state monitoring unit to the arithmetic processor;
  a circuit board provided with the battery information input terminal, the battery state monitoring unit, and the output terminal; and an insulating housing member integrally formed with the battery information input terminal, the battery state monitoring unit, the output terminal, and the circuit board so as to accommodate at least the whole battery state monitoring unit and the whole circuit board and expose the terminal connecting portion of the battery information input terminal and the terminal connection portion of the output terminal to an outside, wherein the housing member has a first connector fitting portion into which the first counter connector is fit and a second connector fitting portion into which the second counter connector is fit, the terminal connecting portion of the battery information input terminal is arranged in the first connector fitting portion in a manner exposed to the outside, and the terminal connecting portion of the output terminal is arranged in the second connector fitting portion in a manner exposed to the outside.

2. The battery monitoring device according to claim 1, wherein
the circuit board includes a plurality of circuit board bodies each provided with a circuit and arranged in multiple layers with a space interposed between board surfaces.

3. The battery monitoring device according to claim 1, further comprising:
a controller that performs control on the battery state monitoring unit and cell balance control on a plurality of battery cells included in the secondary battery based on an operating instruction, and transmits the monitoring information to the arithmetic processor; and
an input terminal that has a terminal connecting portion physically and electrically connected to a counter output terminal of the second counter connector, the input terminal receiving an operating instruction signal indicating the operating instruction from the arithmetic processor, wherein
the terminal connecting portion of the input terminal is arranged in the second connector fitting portion in a manner exposed to the outside.

4. The battery monitoring device according to claim 3, wherein
the circuit board includes a plurality of circuit board bodies each provided with a circuit and arranged in multiple layers with a space interposed between board surfaces,
a first circuit board body out of two circuit board bodies having the board surfaces facing each other is a high-voltage circuit board body provided with a high-voltage system circuit electrically connected to the secondary battery having a high voltage via the battery information input terminal,
a second circuit board body out of the two circuit board bodies having the board surfaces facing each other is a low-voltage circuit board body provided with a low-voltage system circuit electrically connected to an external power supply having a voltage lower than the voltage of the secondary battery,
the high-voltage system circuit includes the battery state monitoring unit, and
the low-voltage system circuit includes the controller.

5. The battery monitoring device according to claim 2, wherein
the circuit board bodies are provided, on the board surfaces facing each other of the circuit board bodies adjacent to each other, with respective electronic components having a height from the board surfaces after being mounted higher than a reference height out of a plurality of types of electronic components constituting the circuits.

6. The battery monitoring device according to claim 4, wherein
the circuit board bodies are provided, on the board surfaces facing each other of the circuit board bodies adjacent to each other, with respective electronic components having a height from the board surfaces after being mounted higher than a reference height out of a plurality of types of electronic components constituting the circuits.

7. The battery monitoring device according to claim 2, wherein
the circuit board includes a coupler that electrically connects the circuits serving as a target of electrical connection and couples the circuit board bodies including the circuits serving as the target of electrical connection.

8. The battery monitoring device according to claim 4, wherein
the circuit board includes a coupler that electrically connects the circuits serving as a target of electrical connection and couples the circuit board bodies including the circuits serving as the target of electrical connection.

9. The battery monitoring device according to claim 5, wherein
the circuit board includes a coupler that electrically connects the circuits serving as a target of electrical connection and couples the circuit board bodies including the circuits serving as the target of electrical connection.

10. The battery monitoring device according to claim 7, wherein
the coupler has sufficient flexibility to be foldable, couples the circuit board bodies adjacent to each other, and causes the circuit board bodies adjacent to each other to be arranged in multiple layers when the coupler is folded.

11. The battery monitoring device according to claim 8, wherein
the coupler has sufficient flexibility to be foldable, couples the circuit board bodies adjacent to each other, and causes the circuit board bodies adjacent to each other to be arranged in multiple layers when the coupler is folded.

12. The battery monitoring device according to claim 9, wherein
the coupler has sufficient flexibility to be foldable, couples the circuit board bodies adjacent to each other, and causes the circuit board bodies adjacent to each other to be arranged in multiple layers when the coupler is folded.

* * * * *